US006911593B2

(12) United States Patent
Mazumder et al.

(10) Patent No.: US 6,911,593 B2
(45) Date of Patent: Jun. 28, 2005

(54) TRANSPARENT SELF-CLEANING DUST SHIELD

(75) Inventors: Malay K. Mazumder, Little Rock, AR (US); Robert A. Sims, Little Rock, AR (US); James D. Wilson, Benton, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 8 days.

(21) Appl. No.: 10/253,625

(22) Filed: Sep. 24, 2002

(65) Prior Publication Data

US 2004/0055632 A1 Mar. 25, 2004

(51) Int. Cl.⁷ ..................... H01L 31/048; H01L 31/042; A47L 13/40
(52) U.S. Cl. ................. 136/251; 136/244; 136/291; 136/293; 323/906; 15/1.51; 134/1
(58) Field of Search ................ 136/251, 244, 136/291, 293; 323/906; 15/1.51; 134/1

(56) References Cited

U.S. PATENT DOCUMENTS

| | | | |
|---|---|---|---|
| 2,789,657 A | | 4/1957 | Fields |
| 3,247,392 A | * | 4/1966 | Thelen .................. 250/226 |
| 3,778,678 A | | 12/1973 | Masuda |
| 3,801,869 A | | 4/1974 | Masuda |
| 3,816,980 A | | 6/1974 | Schwab |
| 4,321,419 A | | 3/1982 | Hanafin |

(Continued)

FOREIGN PATENT DOCUMENTS

| | | |
|---|---|---|
| IL | 52189 | 11/1979 |
| JP | 58-175929 A * | 10/1983 |
| JP | 59-150484 A * | 8/1984 |
| WO | WO 01/05514 A1 | 1/2001 |

OTHER PUBLICATIONS

Masuda, S. et al., Approximate Methods for Calculating a Non–Uniform Travelling Field, *Journal of Electrostatics*, 1 (1975), pp. 351–370, Elsevier Scientific Publishing Company, Amsterdam, The Netherlands.

Masuda, S., Electric Curtain for Confinement and Transport of Charged Aerosol Particles, Albany Conference of Electrostatics—1971, Albany, New York, Jun. 8–11, 1971, Electrostatic Society of America, American Meteorological Society and Institute of Electrical and Electronics Engineers, The Annual General Meeting of Static Electrification Group—1971, London, UK, Oct. 13, 1971, The Institute of Physics and The Physical Society, pp. 1–27 and title page.

*Primary Examiner*—Alan Diamond
(74) *Attorney, Agent, or Firm*—Ray F. Cox, Jr.

(57) ABSTRACT

A transparent electromagnetic shield to protect solar panels and the like from dust deposition. The shield is a panel of clear non-conducting (dielectric) material with embedded parallel electrodes. The panel is coated with a semiconducting film. Desirably the electrodes are transparent. The electrodes are connected to a single-phase AC signal or to a multi-phase AC signal that produces a travelling electromagnetic wave. The electromagnetic field produced by the electrodes lifts dust particles away from the shield and repels charged particles. Deposited dust particles are removed when the electrodes are activated, regardless of the resistivity of the dust. Electrostatic charges on the panel are discharged by the semiconducting film. When used in conjunction with photovoltaic cells, the power for the device may be obtained from the cells themselves. For other surfaces, such as windshields, optical windows and the like, the power must be derived from an external source. One embodiment of the invention employs monitoring and detection devices to determine when the level of obscuration of the screen by dust has reached a threshold level requiring activation of the dust removal feature.

13 Claims, 2 Drawing Sheets

U.S. PATENT DOCUMENTS

| | | |
|---|---|---|
| 4,518,401 A | 5/1985 | Pontius et al. |
| 4,647,179 A | 3/1987 | Schmidlin |
| 4,689,056 A | 8/1987 | Noguchi et al. |
| 5,368,708 A | 11/1994 | Pankow |
| 5,837,035 A | 11/1998 | Braun et al. |
| 5,907,280 A | 5/1999 | Afilani |
| 6,007,771 A | 12/1999 | Rehmeyer et al. |
| 6,046,403 A * | 4/2000 | Yoshikawa et al. .......... 136/257 |
| 6,076,216 A * | 6/2000 | Biryukov .................... 15/1.51 |
| 6,126,722 A | 10/2000 | Mitchell et al. |
| 6,222,115 B1 * | 4/2001 | Nakanishi .................... 136/251 |
| 6,291,762 B1 * | 9/2001 | Jan et al. .................... 136/256 |
| 6,379,427 B1 | 4/2002 | Siess |

* cited by examiner

TRANSPARENT SELF-CLEANING DUST SHIELD

STATEMENT REGARDING FEDERALLY SPONSORED RESEARCH OR DEVELOPMENT

This invention was made with Government support under the terms of DE-FG02-98ER45730 awarded by the Department of Energy/EPSCoR and by the Arkansas Space Grant Consortium which is partially funded by the National Aeronautics and Space Administration/EPSCoR under the terms of Grant No. NGT5-40063. The Government has certain rights in the invention.

CROSS-REFERENCE TO RELATED APPLICATIONS

Not applicable.

BACKGROUND OF THE INVENTION

1. Field of the Invention

The present invention relates to devices for removing deposited dust particles from, and preventing charged particles from depositing on, surfaces, and in particular, to such devices that employ an array of transparent electrodes embedded within a transparent dielectric protective panel overcoated with a semiconducting film.

2. Brief Description of the Related Art

The efficiency of solar photovoltaic arrays may be greatly degraded by the deposition of dust particles, which reduce the amount of light entering the array. There are other devices that also require transparency to light for maximum efficiency, and which likewise suffer when dust deposits on them. These devices can include, without limitation, optical windows such as employed in video cameras, optical or infrared detectors, windshields for various types of vehicles including automobiles and aircraft, and the like. The problem of dust deposition can be particularly severe in dry, windy climates.

Various solutions to the problem of dust deposition on solar arrays have been proposed but none has been entirely satisfactory as described below. References mentioned in this background section are not admitted to be prior art with respect to the present invention.

U.S. Pat. No. 4,321,419 to Hanafin discloses a transparent protective cover for a solar panel. The cover includes a pair of rollers on opposite sides of the solar panel supporting a supply of film material. Clean film material is advanced over the solar panel to prevent excessive dust accumulation.

Electromagnetic traveling wave devices have been employed for moving and sorting particles. A detailed discussion of the theory and practice of using multi-phase traveling electromagnetic waves is presented in WO 0105514. A practical application of these principles is disclosed in U.S. Pat. No. 3,778,678 to Masuda. Masuda discloses a tubular duct of insulating material having three electrodes spirally wound along its outer surface. The electrodes are connected a three-phase current source to produce a traveling wave in the duct by which particles are propelled lengthwise along the duct.

Likewise, a toner-transporting apparatus is disclosed in U.S. Pat. No. 4,647,179 to Schmidlin. Schmidlin discloses a linear electrode array consisting of spaced apart electrodes to which a multi-phase alternating current ("AC") voltage is connected. A traveling wave is formed thereby for transporting toner particles from a toner supply to an imaging surface.

However, to the knowledge of the present inventors such traveling wave techniques have not been applied to the problem of clearing dust particles from the surface of a solar photovoltaic array, an optical window, or similar types of devices where it is desirable to keep a surface free of obscuring dust and to provide maximum light transmission with minimal operational power requirements by employing transparent electrodes, an infrared reflecting film, and automatic (need-based) operation.

The limitations of the prior art are overcome by the present invention as described below.

BRIEF SUMMARY OF THE INVENTION

The present invention is a transparent electromagnetic shield to protect solar arrays and the like from dust deposition. The shield is a panel of clear non-conducting (dielectric) material with an embedded array of linear, parallel electrodes made of either metal wires or conducting transparent strips. The electrodes are connected to a single- or multi-phase AC signal. A multi-phase AC signal is able to produce a travelling electromagnetic wave across the surface of the panel, which is able to sweep dust particles from the surface of the panel. The travelling electromagnetic wave lifts dust particles away from the panel and sweeps them away without using any moving parts. A single-phase AC signal may be effective when a panel is oriented vertically or substantially vertically so that dust particles repelled from the surface of the panel fall by gravity without the need for the travelling electromagnetic wave to sweep the particles away.

When used in conjunction with photovoltaic arrays, the power for the device may be obtained from the photovoltaic cells themselves. For other surfaces, such as windshields, optical windows and the like, the power must be derived from an external source.

One embodiment of the invention employs monitoring and detection devices to determine when the level of obscuration of the screen by dust has reached a threshold level, requiring activation of the dust removal feature. On-demand operation minimizes the power requirements for the device and, in the case of photovoltaic cells, maximizes the net power output.

The present invention is a device that (a) removes deposited dust particles from its surface and (b) repels charged particles, preventing them from depositing on its surface. Dust particles can be of different materials with different electrical properties. Thus the dust particles can be conducting, semi-conducting or insulating. In order to remove uncharged particles deposited on the surface and repel charged particles away from the surface, an array of electrodes are embedded in the transparent dielectric panel of high resistivity (to prevent electrical breakdown between the electrodes).

The front surface of the transparent panel is desirably coated with a thin transparent film of semiconducting material that has controlled surface resistivity. The semiconducting film allows the electrostatic charges accumulated on the surface of the film to decay at a controlled rate. The function of the semiconducting transparent film is to provide tribocharging between the initially uncharged or very lowly charged dust particles that come into contact with the surface. The contact and movement of the particles caused by the electromagnetic field causes tribocharging of the initially uncharged particles to attain a charge of sufficiently high levels that the particles get ejected from the shield or slide from the surface of the shield, thus keeping the shield free of dust. The chemical composition of the thin semiconducting film of the shield is such that the electrostatic charges left on it have a leakage path to ground through the film surface. The film must also have sufficiently high resistivity that the electrical field can penetrate and provide particle transport.

By the addition of an infrared reflective film to the surface of panel, the shield also has the function of reflecting infrared radiation that would otherwise become incident on the photovoltaic array, raising its temperature, which in turn would reduce its efficiency of converting solar energy to electricity. Thus, besides working as a dust shield, the panel can act as a heat shield for solar photovoltaic arrays.

The power supply for the shield, whether single- or multi-phase, is desirably designed to have a low power requirement and to be compact in size. The power supply can operate manually to conserve power, or automatically with minimal power requirements by using a sensor that detects the dust level on the front surface of the dust shield. Depending on the application, the shield may be optimized by changing the the design of the electrodes, its operation from a single- or multi-phase power supply, and the mode of operation.

In another embodiment of the invention, the electrodes are made of nearly transparent conducting strips for maximizing transmission of useful components of solar radiation to the photovoltaic cells or through the optical windows that are being protected by the shield.

It is therefore an object of the present invention to provide for a self-cleaning dust shield for photovoltaic panels and the like in which the dust particles are lifted and swept away by an electromagnetic field, which may be an electromagnetic traveling wave, without requiring any moving parts.

It is a further object of the present invention to provide for such a self-cleaning dust shield with monitoring and detection of obscuration of the shield by the deposition so that the shield is energized when a threshold level of obscuration is exceeded.

It is also an object of the present invention to provide for such a self-cleaning dust shield for photovoltaic panels and the like wherein dust is lifted from the surface without scratching the surface.

These and other features, objects and advantages of the present invention will become better understood from a consideration of the following detailed description of the preferred embodiments and appended claims in conjunction with the drawings as described following:

DETAILED DESCRIPTION OF THE INVENTION

Figure 1:
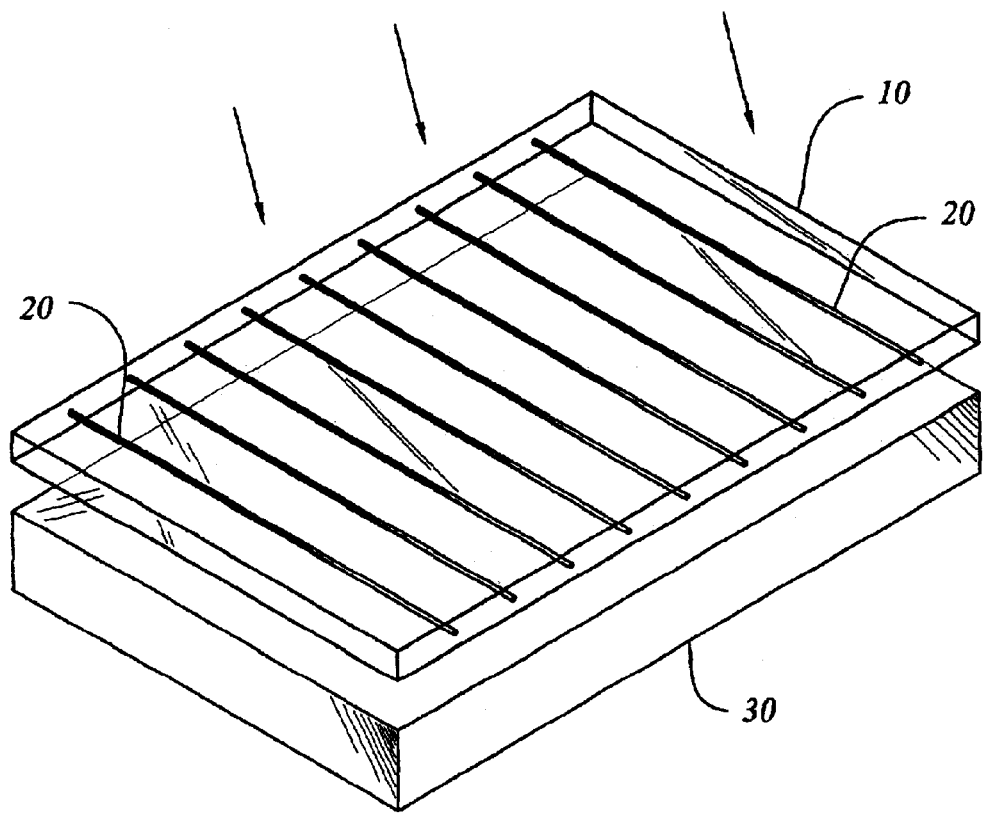
FIG. 1 is a perspective view of the dust shield of the present invention.
Figure 2:
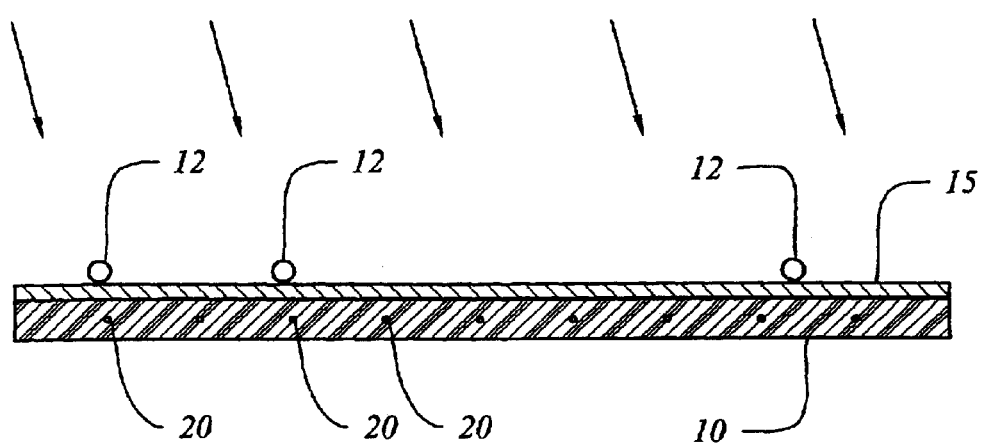
FIG. 2 is a side elevation cross section of the dust shield of FIG. 1.
Figure 3:
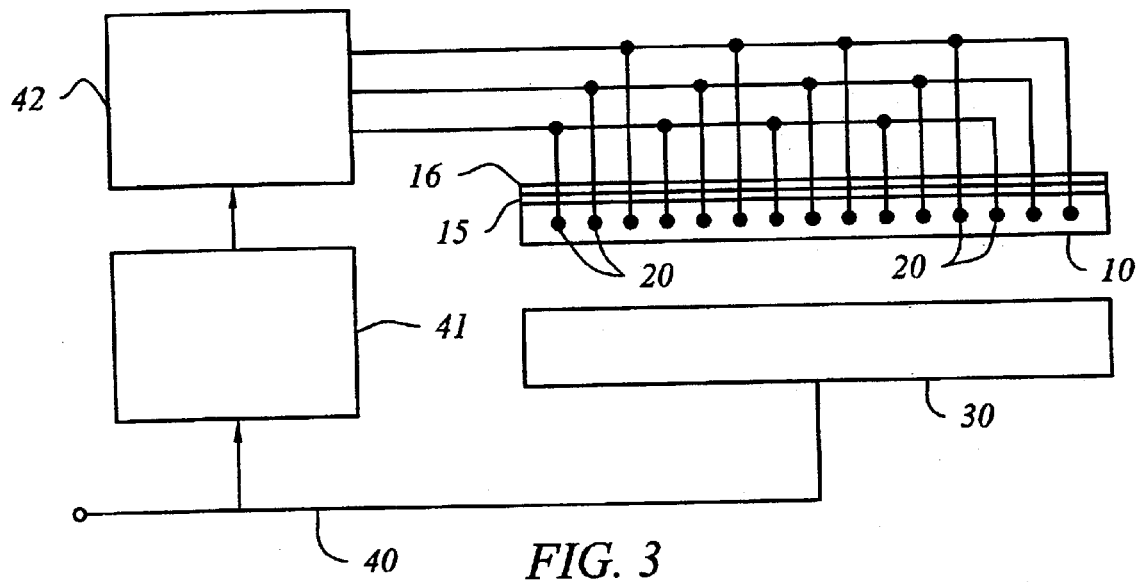
FIG. 3 is a block diagram of the dust shield of the present invention showing a multi-phase AC source.

With reference to FIGS. 1–3, the preferred embodiment of the present invention may be described as follows.

The self-cleaning dust shield of the present invention comprises a transparent panel 10 having associated with it an array of electrodes 20. The panel 10 is a non-conducting, i.e., a dielectric, transparent material. The thickness and rigidity of the transparent panel 10 is desirably such that it provides the necessary mechanical support while allowing the electrical field from the electrodes 20 to penetrate sufficiently across the front surface of the panel 10.

The panel 10 is coated with a semiconducting transparent film 15. The function of the semi-conducting transparent film 15 is to provide tribocharging between the initially uncharged or very lowly charged dust particles 12 that come into contact with the surface. The contact and movement of the particles 12 caused by the electromagnetic field from the electrodes 20 causes tribocharging of the initially uncharged particles 12 to attain a charge of sufficiently high levels that the particles 12 get ejected from the shield or slide from the surface of the shield, thus keeping the shield free of dust. The chemical composition of the thin semiconducting film 15 of the shield is such that the electrostatic charges left on it have a leakage path to ground through the film surface. The film must also have sufficiently high resistivity that the electrical field can penetrate and provide particle transport.

The electrodes 20 are desirably embedded in the transparent panel 10, as shown in FIGS. 1–3. The electrodes 20 are desirably in a parallel linear array that covers substantially all of the transparent panel 10. The electrodes 20 may be formed by deposition processes and may be transparent also. As used herein, the terms "transparent" or "transparency" are intended to refer to any materials that have a high degree of transmissibility of light.

The transparent panel 10 may be used as a stand-alone device or may be associated with another device which requires access to light (schematically illustrated by arrows in FIGS. 1, 2 and 4), such as a photovoltaic array 30. Stand-alone applications could include optical windows, windshields for automobiles and aircraft, and the like.

The transparent panel 10 is placed so as to intercept deposited dust particles 12. As dust particles 12 accumulate on the surface of the transparent panel 10, light passing through the transparent panel 10 is diminished. In applications where the dust shield is protecting a photovoltaic array 30, the increasing obscuration of the transparent panel 10 will reduce the efficiency of conversion of the incident light to energy. As shown in FIG. 3, the energy output 40 from the photovoltaic panel 30 may be measured by monitor 41. The monitor 41 may incorporate or may be powered by batteries operatively associated with the photovoltaic energy output.

In a continuous operation of the dust shield, the electromagnetic field repels any charged particles 12 from depositing on the surface. The uncharged particles 12, if deposited, become charged by triboelectrification and are lifted above the surface and transported away.

In applications where the dust shield is used to protect a photovoltaic array 30, it is desirable that the panel 10 be coated with an infrared reflective coating 16 to minimize heating of the photovoltaic array 30 which would reduce its efficiency in converting incident solar radiation to electrical energy.

When the efficiency of the photovoltaic panel 30 is diminished by a predetermined degree due to dust deposition on the transparent panel 10, a portion of the energy output of the photovoltaic panel 30 may be diverted by the monitor 41 to a power supply 42. Since the output of the photovoltaic panel 30 is direct current, suitable circuitry known in the art is employed to convert the direct current to alternating current ("AC").

The electrodes 20 are connected to a single- or multi-phase AC signal. A multi-phase AC signal is able to produce a travelling electromagnetic wave across the surface of the panel 10, which is able to sweep dust particles from the surface of the panel. The travelling electromagnetic wave lifts dust particles away from the panel 10 and sweeps them away without using any moving parts. A single-phase AC signal may be effective when a panel 10 is oriented vertically or substantially vertically so that dust particles repelled from the surface of the panel 10 fall by gravity without the need for the travelling electromagnetic wave to sweep the particles away. The power supply 42 may thus be either a single- or multi-phase AC source. When the power supply 42 is a multi-phase AC source then the phases are connected to groups of electrodes 20 in order to permit the creation of a traveling electromagnetic wave. In FIG. 3, an exemplary array of three sets of electrodes 20 is shown for receiving three-phase AC. The multi-phase AC, when applied to the array of electrodes 20 produces a traveling electromagnetic wave which sweeps the dust particles 12 from the surface of the transparent panel 10.

With the obscuring dust removed, the monitor 41 registers the increased efficiency in the output of the photovoltaic array 30 and disconnects the power source from the multi-phase AC source 42. Since the use of the self-cleaning feature of the dust shield is intermittent, minimal power is robbed from the photovoltaic array 30.

Figure 4:
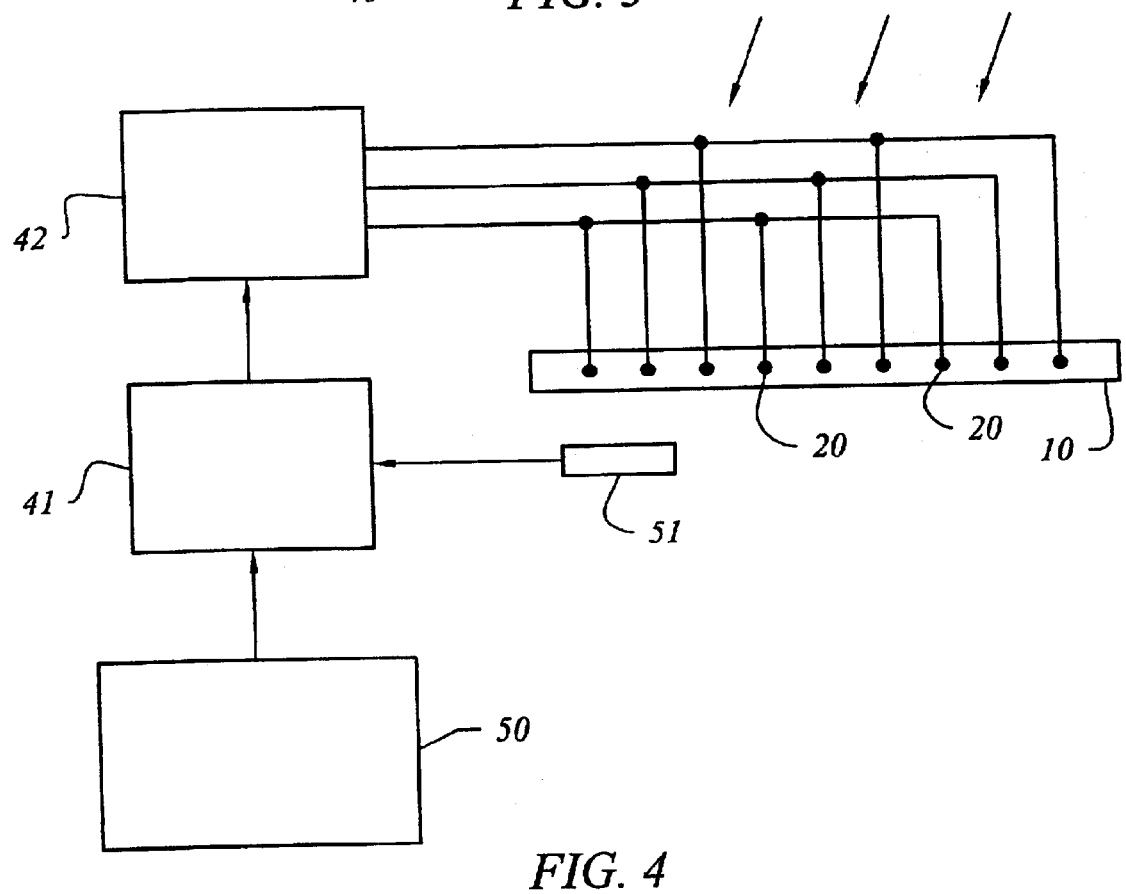
FIG. 4 is a block diagram of the dust shield of the present invention showing an embodiment having an independent power source with a sensor and monitor for activating the power supply when a predetermined degree of obscuration of the transparent panel by dust occurs.

When the dust shield of the present invention is not used in conjunction with a photovoltaic array, an independent power source 50 is required as shown in FIG. 4. In such applications, a sensor 51 may be used to sense the degree of obscuration of the transparent panel 10 by dust. When a predetermined degree of obscuration occurs, then the monitor 41 activates the power supply 42 as described previously.

The present invention has been described with reference to certain preferred and alternative embodiments that are intended to be exemplary only and not limiting to the full scope of the present invention as set forth in the appended claims.

What is claimed is:

1. A self-cleaning dust shield, comprising:
    a transparent dielectric panel coated with a transparent semiconducting film;
    a plurality of electrodes embedded in said panel;
    an alternating current power supply operatively connected to said plurality of electrodes;
    means for detecting a specified degree of obscuration by dust of light passing through said transparent panel; and
    means for activating said power supply at said specified degree of obscuration of light passing through said transparent panel;
    wherein said transparent semiconductor film provides tribocharging of dust particles that come into contact with the surface of the transparent dielectric panel.

2. The self-cleaning dust shield of claim 1 further comprising:
    a solar photovoltaic array shielded by said transparent panel; and
    wherein said transparent dielectric panel further comprises an infrared reflecting film.

3. The self-cleaning dust shield of claim 2 wherein said means for detecting obscuration by dust of light passing through said transparent panel comprises means for detecting a reduction in the efficiency of said photovoltaic array.

4. The self-cleaning dust shield of claim 3 further comprising
    means for storage of energy generated by said photovoltaic array; and
    further wherein said means for activating said power supply comprises means for operatively connecting said means for storage of energy to said power supply.

5. The self-cleaning dust shield of claim 1 where said alternating current power supply is a single-phase power supply.

6. The self-cleaning dust shield of claim 1 wherein said alternating current power supply is a multi-phase power supply means operatively connected to said electrodes for generating a traveling electromagnetic wave across said panel.

7. The self-cleaning dust shield of claim 1 wherein said electrodes are transparent.

8. A self-cleaning dust shield, comprising:
    a transparent dielectric panel coated with a transparent semiconducting film and an infrared reflecting film;
    a plurality of transparent electrodes embedded in said panel;
    a solar photovoltaic array shielded by said transparent panel; and
    an alternating current power supply operatively connected to said plurality of electrodes;
    wherein said transparent semiconductor film provides tribocharging of dust particles that come into contact with the surface of the transparent dielectric panel.

9. The self-cleaning dust shield of claim 8, further comprising
    means for detecting a specified degree of obscuration by dust of light passing through said transparent panel; and
    means for activating said power supply at said specified degree of obscuration of light passing through said transparent panel.

10. The self-cleaning dust shield of claim 9 wherein
    said means for detecting obscuration by dust of light passing through said transparent panel comprises means for detecting a reduction in the efficiency of said photovoltaic array.

11. The self-cleaning dust shield of claim 10 further comprising
    means for storage of energy generated by said photovoltaic array; and
    further wherein said means for activating said power supply comprises means for operatively connecting said means for storage of energy to said power supply.

12. The self-cleaning dust shield of claim 11 where said alternating current power supply is a single-phase power supply.

13. The self-cleaning dust shield of claim 11 wherein said alternating current power supply is a multi-phase power supply means operatively connected to said electrodes for generating a traveling electromagnetic wave across said panel.

* * * * *

UNITED STATES PATENT AND TRADEMARK OFFICE
CERTIFICATE OF CORRECTION

PATENT NO. : 6,911,593 B2
DATED : June 28, 2005
INVENTOR(S) : Mazumder, M. et al.

It is certified that error appears in the above-identified patent and that said Letters Patent is hereby corrected as shown below:

Title page,
Item [75], Inventors, following "James D. Wilson, Benton, AR (US)", insert
-- Alexandru S. Biris, Little Rock, AR (US) --.

Signed and Sealed this

Twenty-third Day of August, 2005

JON W. DUDAS
*Director of the United States Patent and Trademark Office*